United States Patent
Shin et al.

(10) Patent No.: US 9,384,851 B2
(45) Date of Patent: Jul. 5, 2016

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Tae Kyun Shin, Icheon-si (KR); Nark Hyung Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 284 days.

(21) Appl. No.: 14/174,779

(22) Filed: Feb. 6, 2014

(65) Prior Publication Data
US 2015/0221395 A1    Aug. 6, 2015

(51) Int. Cl.
G11C 29/00    (2006.01)
G11C 17/18    (2006.01)
G11C 17/16    (2006.01)
G11C 29/44    (2006.01)

(52) U.S. Cl.
CPC ............. *G11C 17/18* (2013.01); *G11C 17/16* (2013.01); *G11C 29/4401* (2013.01); *G11C 29/78* (2013.01); *G11C 2029/4402* (2013.01)

(58) Field of Classification Search
CPC .... G11C 17/18; G11C 17/16; G11C 29/4401; G11C 2029/4402; G11C 29/78
See application file for complete search history.

(56) References Cited

U.S. PATENT DOCUMENTS

| | | | | |
|---|---|---|---|---|
| 5,768,212 A * | 6/1998 | Fujita | ............. | G11C 7/1018 365/189.05 |
| 2004/0190328 A1* | 9/2004 | Lee | ............. | G11C 5/025 365/149 |
| 2005/0190636 A1* | 9/2005 | Otsuka | ............. | G11C 17/16 365/232 |
| 2006/0007739 A1* | 1/2006 | Takeda | ............. | G11C 29/44 365/185.09 |
| 2008/0065929 A1* | 3/2008 | Nadeau-Dostie | .. | G11C 29/4401 714/5.11 |
| 2009/0108895 A1* | 4/2009 | Saint-Laurent | ....... | H03K 3/037 327/176 |
| 2009/0122589 A1* | 5/2009 | Chang | ............. | G11C 29/02 365/96 |
| 2011/0110164 A1* | 5/2011 | Jeong | ............. | G11C 29/02 365/189.02 |

FOREIGN PATENT DOCUMENTS

KR    1020090041524 A    4/2009

* cited by examiner

*Primary Examiner* — Bryce Bonzo
*Assistant Examiner* — Thien D Nguyen
(74) *Attorney, Agent, or Firm* — William Park & Associates Ltd.

(57) ABSTRACT

The semiconductor device includes a latch pulse generator and a data latch unit. The latch pulse generator generates a test section signal in response to a test pulse signal. Further, the latch pulse generator generates a first latch pulse signal in response to the test pulse signal and the test section signal. The data latch unit latches a selection data in response to the first latch pulse signal to generate a fuse data for programming a fuse array.

19 Claims, 5 Drawing Sheets

SEMICONDUCTOR DEVICES AND SEMICONDUCTOR SYSTEMS INCLUDING THE SAME

BACKGROUND

1. Technical Field

Embodiments of the present disclosure relate to semiconductor devices and semiconductor systems including the same.

2. Related Art

Semiconductor devices may be regarded as failed devices if at least one of memory cells included in each of the semiconductor devices abnormally operates. As the semiconductor devices become more highly integrated, the number of the failed devices has been continuously increased. Thus, the semiconductor devices may be designed to include redundancy cells. That is, if the semiconductor device has abnormal memory cells, a repair operation may be executed to replace the abnormal memory cells with the redundancy cells. The semiconductor device may store information on the abnormal memory cells therein to execute the repair operation.

Each of the semiconductor devices may be designed to include fuses that store information necessary for various internal control operations, for example, the information on the abnormal memory cells. General fuses can be programmed in a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a nonvolatile memory (NVM) cell transistor having a floating gate or a charge trapping layer. In such a case, a data may be stored in the e-fuse by programming or erasing the transistor to change a threshold voltage of the transistor. That is, the e-fuse may be electrically open or short according to a resistance value between a source and a drain of the transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. In the event that the e-fuse arrays are employed in the semiconductor devices, the e-fuse arrays may share the amplifiers with each other. Accordingly, the integration density of the semiconductor devices may be improved.

SUMMARY

Various embodiments are directed to semiconductor devices and semiconductor systems including the same.

According to various embodiments, a semiconductor device includes a latch pulse generator and a data latch unit. The latch pulse generator generates a test section signal in response to a test pulse signal. Further, the latch pulse generator generates a first latch pulse signal in response to the test pulse signal and the test section signal. The data latch unit latches a selection data in response to the first latch pulse signal to generate a fuse data for programming a fuse array.

According to various embodiments, a semiconductor system includes a controller and a semiconductor device. The controller generates a first external command signal and a second external command signal. The semiconductor device generates a first latch pulse signal or a second latch pulse signal in response to the first and second external command signals. The semiconductor device latches a selection data in response to the first latch pulse signal or the second latch pulse signal to generate a fuse data for programming a fuse array.

According to an embodiment of the present invention, a system comprises: a processor; a controller configured to receive a request and a data from the processor; and a memory unit configured to receive the request and the data from the controller, wherein the memory unit includes: a latch pulse generator suitable for generating a test section signal enabled in response to a test pulse signal and generating a first latch pulse signal in response to the test pulse signal and the test section signal; and a data latch unit suitable for latching a selection data in response to the first latch pulse signal to generate a fuse data for programming a fuse array.

BRIEF DESCRIPTION OF THE DRAWINGS

Embodiments of the present invention will become more apparent in view of the attached drawings and accompanying detailed description, in which.

DETAILED DESCRIPTION

Embodiments of the present invention will be described hereinafter with reference to the accompanying drawings. However, the embodiments described herein are for illustrative purposes only and are not intended to limit the scope of the invention.

Figure 1:
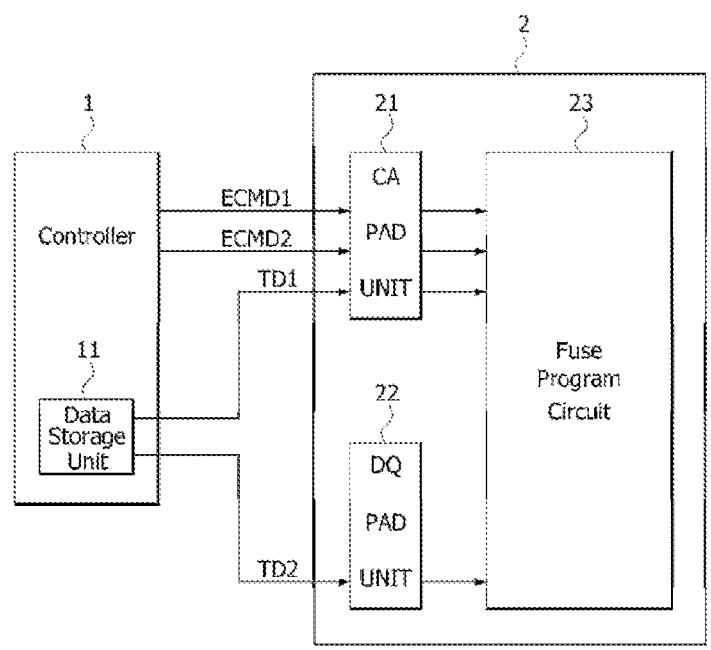
FIG. 1 is a block diagram illustrating a semiconductor system according to an embodiment of the present invention.

Referring to FIG. 1, a semiconductor system according to an embodiment may include a controller 1 and a semiconductor device 2.

The controller 1 may include a data storage unit 11 that stores first transmission data TD1 and second transmission data TD2. The controller 1 may apply a first external command signal ECMD1 together with the first transmission data TD1 to the semiconductor device 2. In addition, the controller 1 may apply a second external command signal ECMD2 together with the second transmission data TD2 to the semiconductor device 2. The first and second transmission data TD1 and TD2 may include information on abnormal memory cells (not shown). The first and second transmission data TD1 and TD2 may be generated when the abnormal memory cells are tested and may be stored in the data storage unit 11. The abnormal memory cells may be tested by a separate test equipment or the controller 1.

The semiconductor device 2 may include a command/address (CA) pad unit 21, a data (DQ) pad unit 22 and a fuse program circuit 23. The first and second external command signals ECMD1 and ECMD2 may be applied to the CA pad unit 21. When the first external command signal ECMD1 is applied to the CA pad unit 21, the first transmission data TD1 may also be applied to the CA pad unit 21. When the second command signal ECMD2 is applied to the CA pad unit 21, the second transmission data TD2 may be applied to the DQ pad unit 22. The fuse program circuit 23 may program a fuse array (not shown) in response to the first and second external command signals ECMD1 and ECMD2 and the first transmission data TD1 which are inputted through the CA pad unit 21 and the second transmission data TD2 which are inputted through the DQ pad unit 22. The CA pad unit 21 may include a plurality of pads to which external address signals and external command signals are applied. The DQ pad unit 22 may include a plurality pads through which a plurality of data are inputted and outputted. In various embodiments, the first external command signal ECMD1 and the second external command signal ECMD2 may be obtained from the same external command signal; and a logic combination of the first external command signal ECMD1 may be different from that of the second external command signal ECMD2. Alternatively, the first external command signal ECMD1 and the second external command signal ECMD2 may be obtained from two different external command signals.

Figure 2:
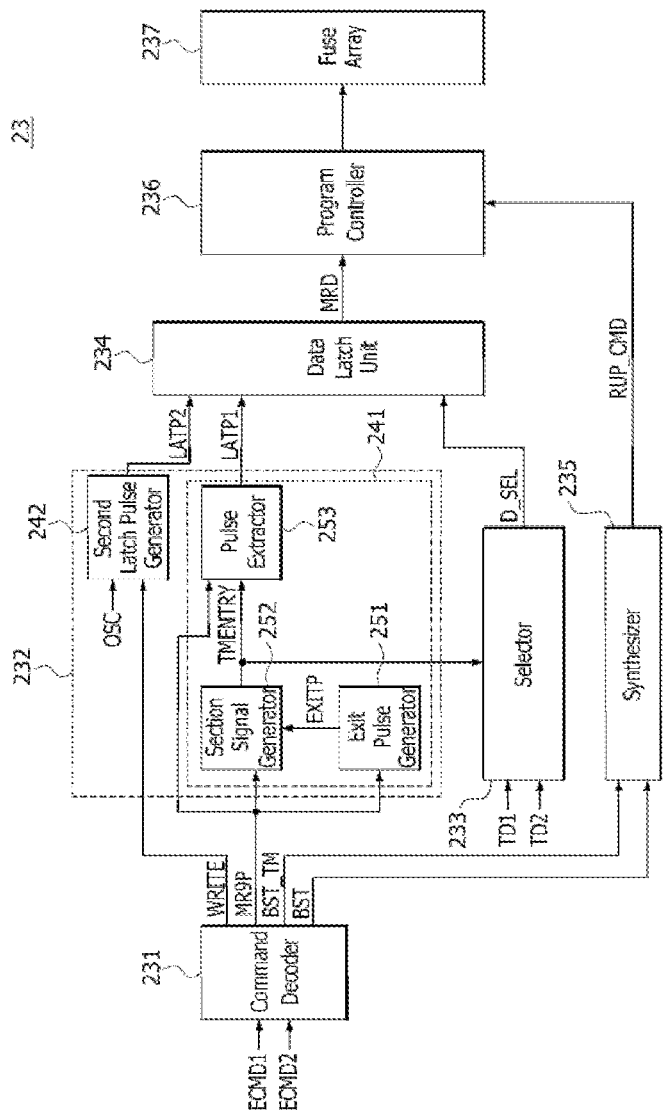
FIG. 2 is a block diagram illustrating a fuse program circuit included in the semiconductor system of FIG. 1.

Referring to FIG. 2, the fuse program circuit 23 may include a command decoder 231, a latch pulse generator 232, a selector 233, a data latch unit 234, a synthesizer 235, a program controller 236 and a fuse array 237.

The command decoder 231 may generate a test pulse signal MR9P and a test burst signal BST_TM when the first external command signal ECMD1 is inputted thereto. The command decoder 231 may generate a write signal WRITE and a burst signal BST when the second external command signal ECMD2 is inputted thereto. The test pulse signal MR9P may include a plurality of pulses which are sequentially generated. The write signal WRITE may be set to be enabled while a write operation is executed. The test burst signal BST_TM and the burst signal BST may be created as a pulse signal or a level signal after the data latch unit 234 generates a fuse data MRD.

The latch pulse generator 232 may include a first latch pulse generator 241 and a second latch pulse generator 242. The first latch pulse generator 241 may include an exit pulse generator 251, a section signal generator 252 and a pulse extractor 253. The exit pulse generator 251 may generate an exit pulse signal EXITP including a pulse which is created in synchronization with the test pulse signal MR9P. In various embodiments, the pulse of the exit pulse signal EXITP may be created in synchronization with a fifth pulse of the test pulse signal MR9P. The section signal generator 252 may generate a test section signal TMENTRY enabled in synchronization with the test pulse signal MR9P and the exit pulse signal EXITP. The test section signal TMENTRY may be enabled in synchronization with a first pulse included in the test pulse signal MR9P and may be disabled in synchronization with a pulse included in the exit pulse signal EXITP. The pulse extractor 253 may output the test pulse signal MR9P as a first latch pulse signal LATP1 while the test section signal TMENTRY is enabled. The second latch pulse generator 242 may output an oscillation signal OSC as a second latch pulse signal LATP2 while the write signal WRITE is enabled.

The selector 233 may output the first or second transmission data TD1 or TD2 as a selection data DSEL in response to the test section signal TMENTRY. For example, the selector 233 may output the first transmission data TD1 as the selection data DSEL while the test section signal TMENTRY is enabled and the selector 233 may output the second transmission data TD2 as the selection data DSEL while the test section signal TMENTRY is disabled.

The data latch unit 234 may latch the selection data DSEL in synchronization with the first or second latch pulse signal LATP1 or LATP2 to generate the fuse data MRD. The synthesizer 235 may generate a control command signal RUP_CMD enabled when the test burst signal BST_TM or the burst signal BST is generated. The program controller 236 may control a program operation of the fuse array 237 according to the fuse data MRD when the control command signal RUP_CMD is enabled.

An operation of the semiconductor system having the aforementioned configuration will be described hereinafter with reference to FIGS. 3 and 4 in conjunction with an example in which the first external command signal ECMD1 is applied to the semiconductor device 2 and an example in which the second external command signal ECMD2 is applied to the semiconductor device 2.

Figure 3:
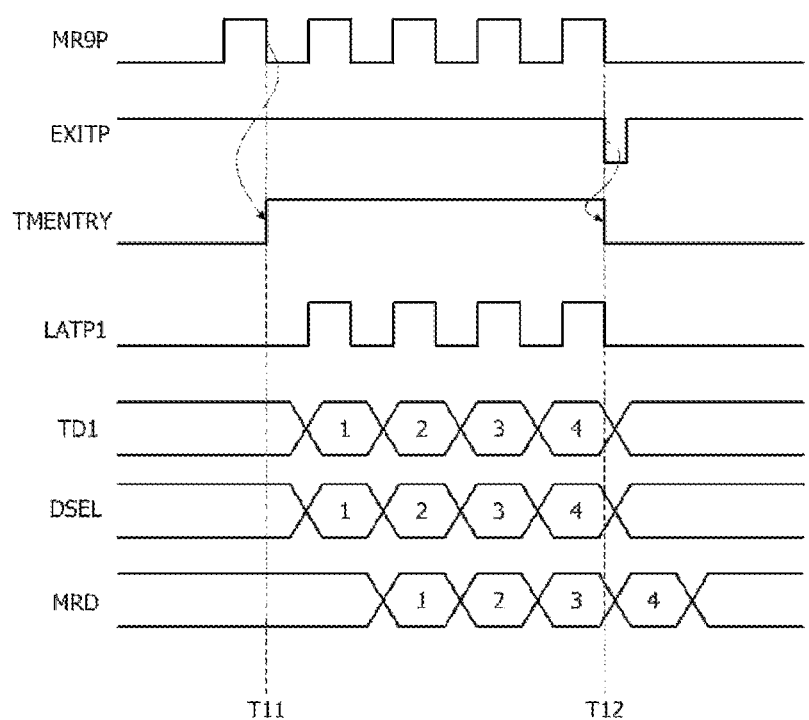
FIGS. 3 and 4 are timing diagrams illustrating operations of the semiconductor system shown in FIG. 1.

Referring to FIG. 3, the test pulse signal MR9P may be generated if the first external command signal ECMD1 is applied to the semiconductor device 2. The test section signal TMENTRY may be enabled in synchronization with a first pulse of the test pulse signal MR9P to have a logic "high" level at a point of time "T11". At a point of time "T12", a pulse of the exit pulse signal EXITP may be created in synchronization with a fifth pulse of the test pulse signal MR9P to disable the test section signal TMENTRY to a logic "low" level. Because the test section signal TMENTRY is enabled to have a logic "high" level during a period between the point of time "T11" and the point of time "T12", the test pulse signal MR9P may be outputted as the first latch pulse signal LATP1 during the period between the points of time "T11" and "T12"; and the first transmission data TD1 may be outputted as the selection data DSEL during the period between the points of time "T11" and "T12". The selection data DSEL may be latched in response to the first latch pulse signal LATP1 to be outputted as the fuse data MRD.

Figure 4:
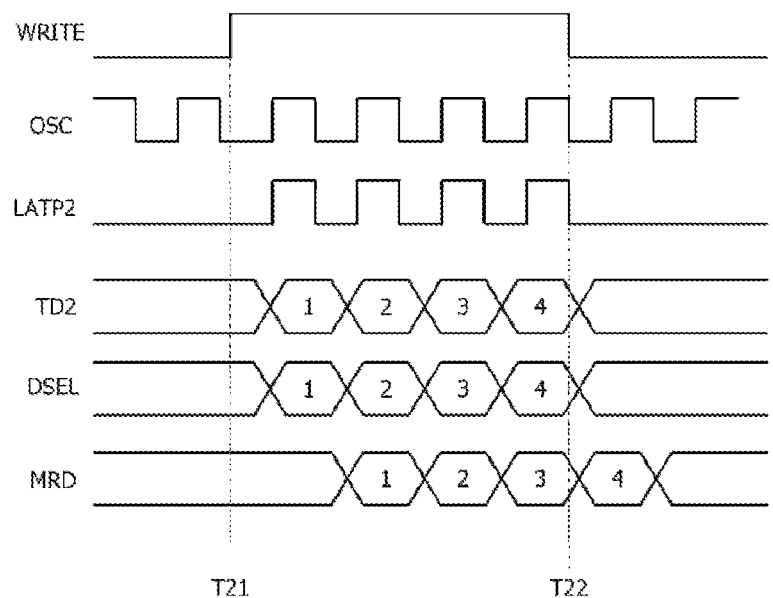

Referring to FIG. 4, the write signal WRITE may be enabled to have a logic "high" level during a period from a point of time "T21" till a point of time "T22" if the second external command signal ECMD2 is applied to the semiconductor device 2. Because the write signal WRITE is enabled to have a logic "high" level during the period between the points of time "T21" and "T22"; the oscillation signal OSC may be outputted as the second latch pulse signal LATP2 during the period between the points of time "T11" and "T12"; and the second transmission data TD2 may be outputted as the selection data DSEL during the period between the points of time "T11" and "T12". The selection data DSEL may be latched in response to the second latch pulse signal LATP2 to be outputted as the fuse data MRD.

Figure 5:
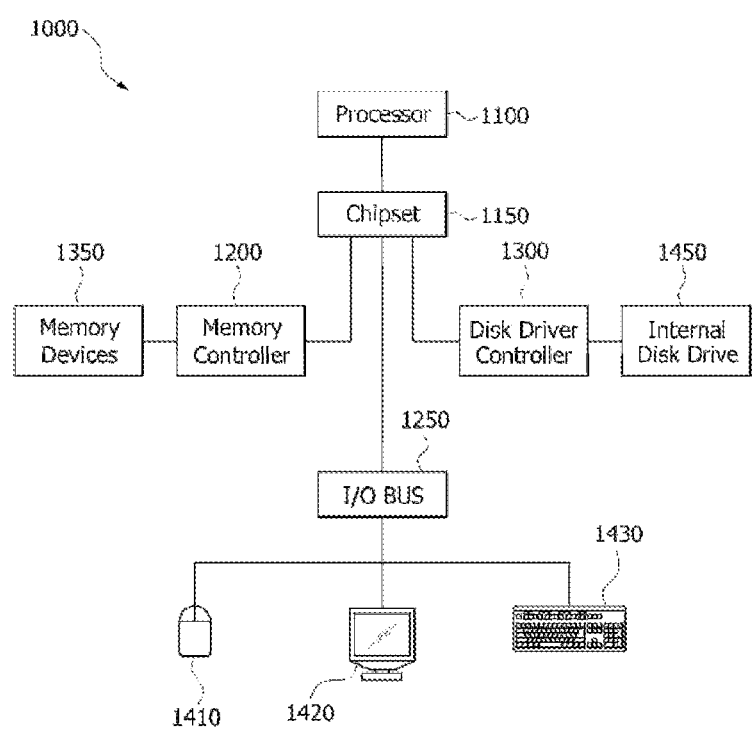
FIG. 5 illustrates a block diagram of a system employing a memory controller circuit in accordance with an embodiment of the present invention.

Referring to FIG. 5, a system 1000 may include one or more processors 1100. The processor 1100 may be used individually or in combination with other processors. A chipset 1150 may be operably coupled to the processor 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably coupled to the chipset 1150. The memory controller 1200 can receive a request provided from the processor 1100, through the chipset 1150. The memory controller 1200 may be operably coupled to one or more memory devices 1350. The memory devices 1350 may include the semiconductor system described above.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be operably coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol, including all of those mentioned above with regard to the I/O bus 1250.

As described above, the semiconductor system according to the embodiments may receive data which are capable of programming the fuse array 237 through not only the DQ pad unit 22 but also the CA pad unit 21. Further, the semiconductor system according to the embodiments may latch the data inputted through the CA pad unit 21 to provide a test mode which is capable of generating the fuse data MRD. Thus, the fuse array 237 can be programmed even after the semiconductor system or the semiconductor device is encapsulated to form a package.

What is claimed is:

1. The semiconductor device comprising: a latch pulse generator configured to generate a test section signal enabled in response to a test pulse signal and generate a first latch pulse signal in response to the test pulse signal and the test section signal; and
   a data latch unit configured to latch a selection data in response to the first latch pulse signal to generate a fuse data for programming a fuse array, wherein the first latch pulse signal is generated from the test pulse signal while the test section signal is enabled.

2. The semiconductor device of claim 1, wherein the test section signal is enabled in synchronization with a first pulse of the test pulse signal and is disabled in synchronization with an $N^{th}$ pulse of the test pulse signal (wherein, "N" denotes a natural number which is equal to or greater than two).

3. The semiconductor device of claim 1, wherein the latch pulse generator includes:
   an exit pulse generator configured to generate an exit pulse signal in synchronization with the test pulse signal;
   a section signal generator configured to generate the test section signal in synchronization with the test pulse signal and the exit pulse signal; and
   a pulse extractor configured to extract the first latch pulse signal from the test pulse signal in response to the test section signal.

4. The semiconductor device of claim 3, wherein the test section signal is enabled in synchronization with the test pulse signal and is disabled in synchronization with the exit pulse signal.

5. The semiconductor device of claim 3, wherein the exit pulse signal includes a pulse which is created in synchronization with an $N^{th}$ pulse of the test pulse signal (wherein, "N" denotes a natural number which is equal to or greater than two).

6. The semiconductor device of claim 1, wherein the selection data is generated from a first transmission data or a second transmission data in response to the test section signal.

7. The semiconductor device of claim 6, wherein the selection data is generated from the first transmission data while the test section signal is enabled.

8. The semiconductor device of claim 6,
   wherein the first transmission data is inputted through a first pad unit when a first external command signal is applied to the semiconductor device; and
   wherein the second transmission data is inputted through a second pad unit when a second external command signal is applied to the semiconductor device.

9. The semiconductor device of claim 8,
   wherein the first pad unit receives a command signal and an address signal.

10. The semiconductor device of claim 1, wherein the latch pulse generator generates a second latch pulse signal for latching the selection data in response to a write signal.

11. A semiconductor system comprising:
    a controller configured to generate a first external command signal and a second external command signal, a first transmission data and a second transmission data; and
    a semiconductor device configured to generate a first latch pulse signal or a second latch pulse signal in response to the first and second external command signals and latch a selection data in response to the first latch pulse signal or the second latch pulse signal to generate a fuse data for programming a fuse array, wherein the first latch pulse signal is generated from a test pulse signal while a test section signal is enabled.

12. The semiconductor system of claim 11,
    wherein the controller includes a data storage unit that stores a first and a second transmission data;
    wherein the first external command signal is applied to the semiconductor device together with the first transmission data; and
    wherein the second external command signal is applied to the semiconductor device together with the second transmission data.

13. The semiconductor system of claim 12,
    wherein the semiconductor device includes a first pad unit to which a command signal and an address signal are applied and a second pad unit;
    wherein the first transmission data is applied to the first pad unit; and
    wherein the second transmission data is applied to the second pad unit.

14. The semiconductor system of claim 11, wherein the semiconductor device includes:
    a command decoder suitable for generating a write signal when the second external command signal is inputted thereto and suitable for generating the test pulse signal when the first external command signal is inputted thereto; and
    a latch pulse generator suitable for generating the test section signal and the first latch pulse signal in response to the test pulse signal and suitable for generating the second latch pulse signal in response to the write signal.

15. The semiconductor system of claim 14, wherein the semiconductor device further includes a selector suitable for generating the selection data from a first or a second transmission data in response to the test section signal.

16. The semiconductor system of claim 14, wherein the test section signal is enabled in synchronization with a first pulse of the test pulse signal and is disabled in synchronization with an $N^{th}$ pulse of the test pulse signal (wherein, "N" denotes a natural number which is equal to or greater than two).

17. The semiconductor system of claim 14, wherein the latch pulse generator includes:
- a section signal generator suitable for generating the test section signal in synchronization with the test pulse signal and an exit pulse signal;
- an exit pulse generator suitable for generating the exit pulse signal in synchronization with the test pulse signal; and
- a pulse extractor suitable for extracting the first latch pulse signal from the test pulse signal in response to the test section signal.

18. The semiconductor device of claim 17, wherein the test section signal is enabled in synchronization with the test pulse signal and is disabled in synchronization with the exit pulse signal.

19. The semiconductor device of claim 17, wherein the exit pulse signal includes a pulse which is created in synchronization with an $N^{th}$ pulse of the test pulse signal (wherein, "N" denotes a natural number which is equal to or greater than two).

* * * * *